United States Patent [19]

Wendler et al.

[11] Patent Number: 5,173,671
[45] Date of Patent: Dec. 22, 1992

[54] MONOLITHIC LUMPED ELEMENT NETWORKS

[75] Inventors: John P. Wendler, Brighton; Alan Palevsky, Wayland, both of Mass.

[73] Assignee: Raytheon Company, Lexington, Mass.

[21] Appl. No.: 629,318

[22] Filed: Dec. 18, 1990

[51] Int. Cl.⁵ .............................................. H03H 7/00
[52] U.S. Cl. .................................... 333/185; 333/184; 333/167; 333/204
[58] Field of Search ................ 333/185, 184, 181, 167, 333/156, 174, 175, 176, 172, 202, 246, 138, 204, 24 R, 24 C, 177; 336/200, 222, 232

[56] References Cited

U.S. PATENT DOCUMENTS

| | | | |
|---|---|---|---|
| 4,881,050 | 11/1989 | Swanson, Jr. | 333/185 |
| 4,926,292 | 5/1990 | Maple | 333/185 X |
| 5,032,810 | 7/1991 | Kaneko et al. | 333/185 |
| 5,075,650 | 12/1991 | Okamura et al. | 333/177 |

Primary Examiner—Eugene R. LaRoche
Assistant Examiner—Ali Neyzari
Attorney, Agent, or Firm—Denis G. Maloney; Richard M. Sharkansky

[57] ABSTRACT

An RF circuit which may be for example a high pass filter, low pass filter, phase shifter, bandpass filter, termination network, bias network, or series or parallel resonance circuit includes at least one strip conductor coiled about a region and an outer or ring strip conductor disposed about a periphery of the at least one coiled strip conductor and coupled to said at least one coiled strip conductor through a dielectric. Parasitic capacitance between the coiled conductor and outer or ring conductor provide capacitor elements for the circuit.

25 Claims, 7 Drawing Sheets

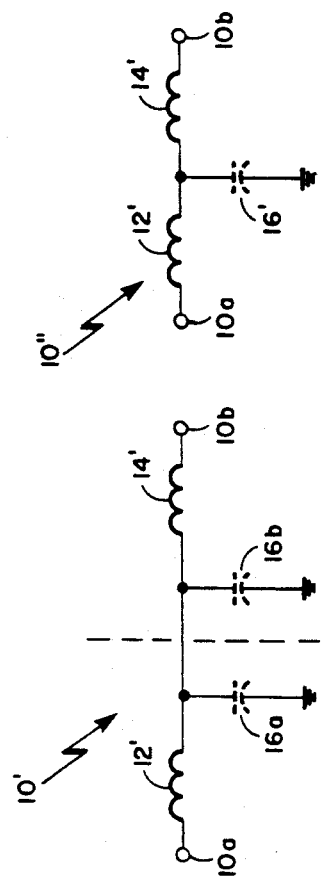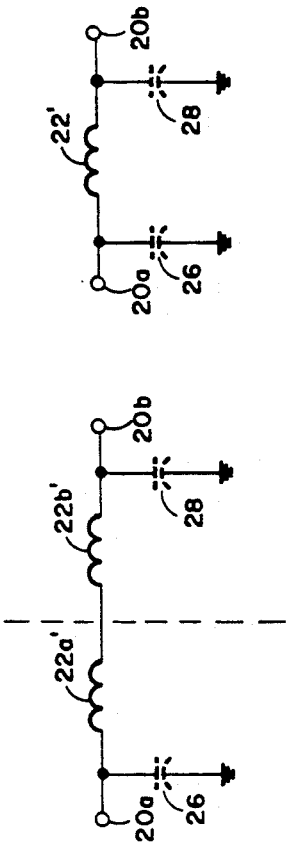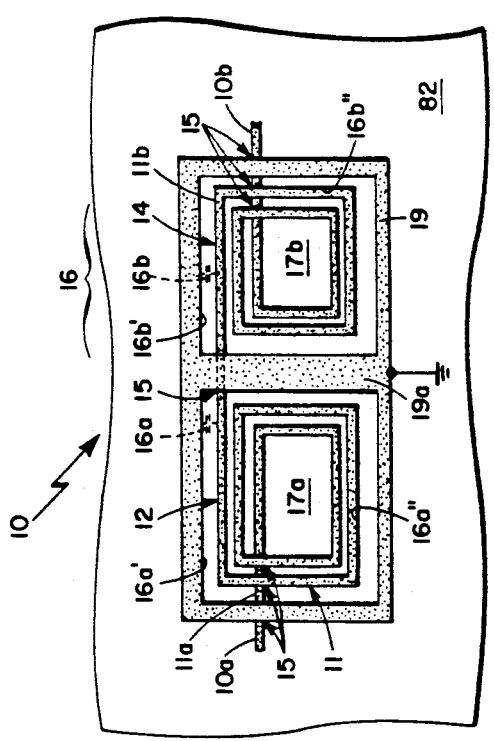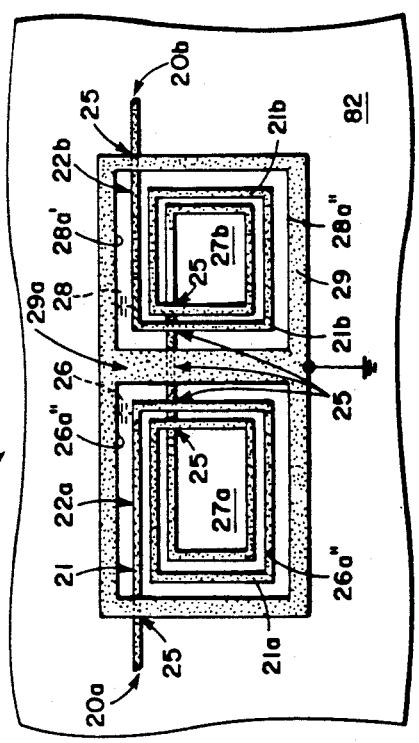

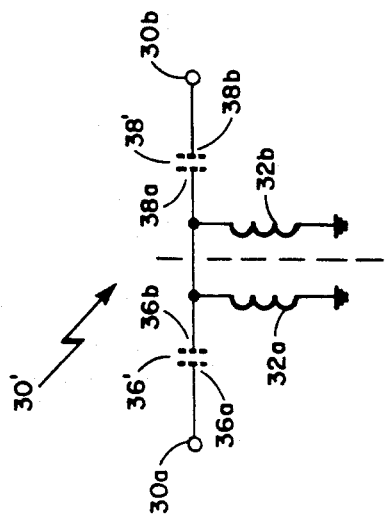
Fig. 3A
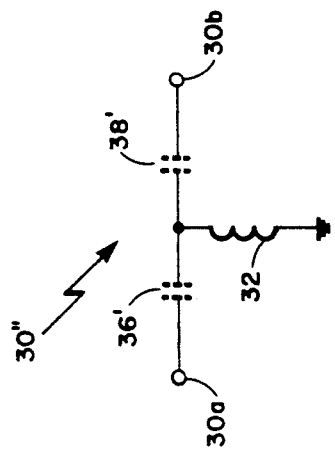
Fig. 3B
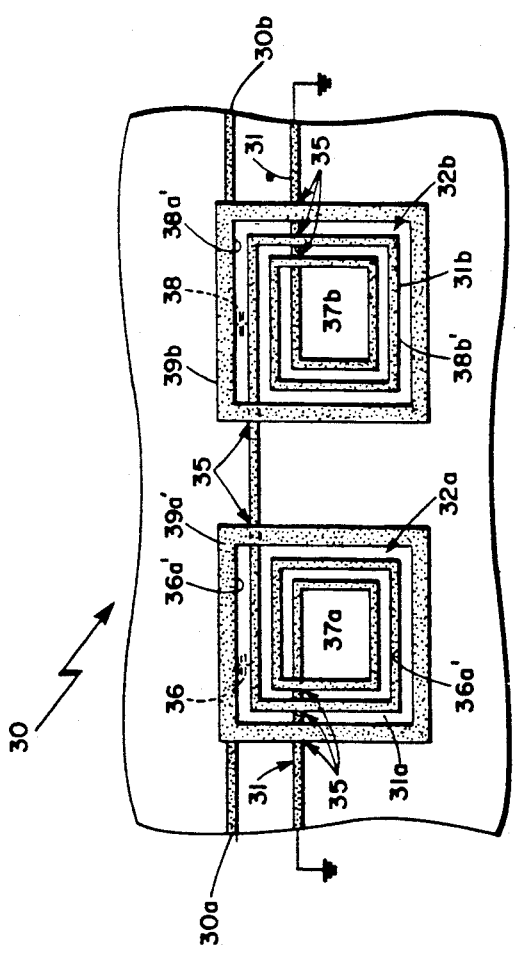
Fig. 3
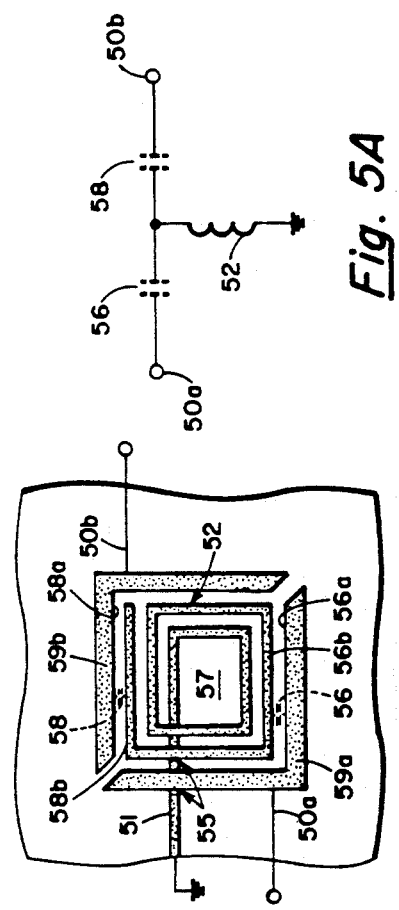
Fig. 5A
Fig. 5

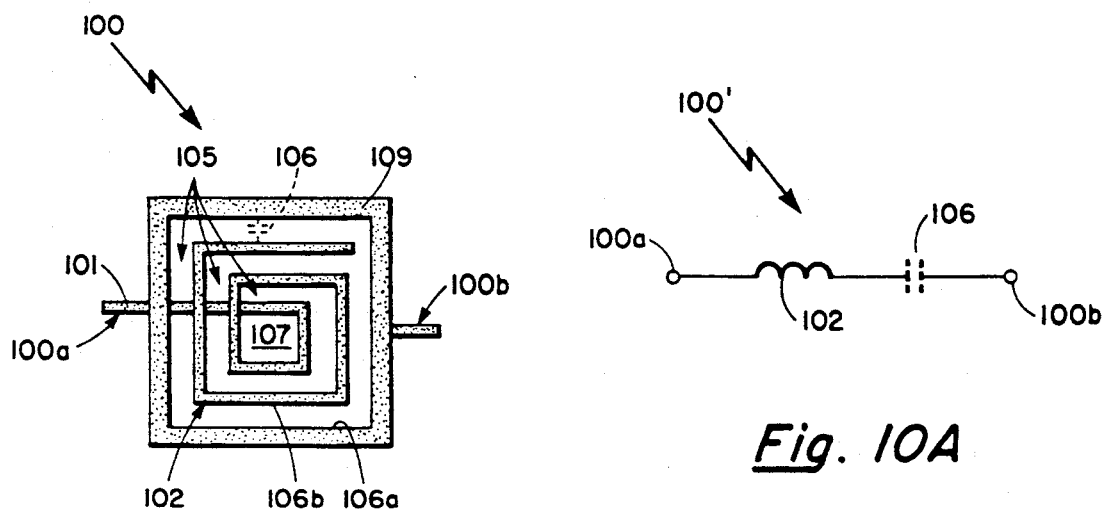
Fig. 10
Fig. 10A
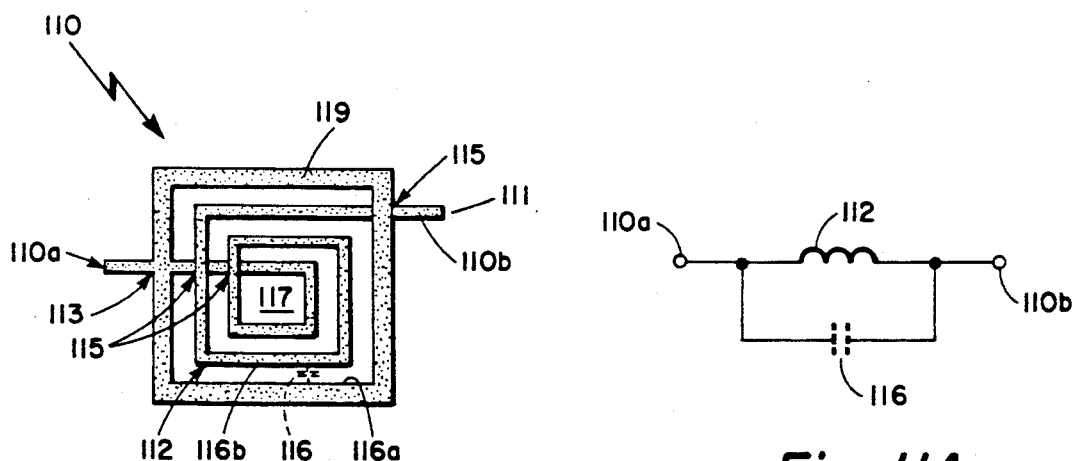
Fig. 11
Fig. 11A

MONOLITHIC LUMPED ELEMENT NETWORKS

BACKGROUND OF THE INVENTION

This invention relates generally to microwave monolithic integrated circuits and more particularly to monolithic lumped element circuit networks.

As it is known in the art, so-called microwave monolithic integrated circuits (MMICs) include active and passive devices which are formed over suitable semiconductor substrates using semiconductor integrated circuit techniques to provide various types of microwave circuits. Amongst the circuits provided are filters, amplifiers, phase shifters, switches, and the like. Often such circuits are integrated together to form higher order integrated functions. A common network employed in such integrated circuits are lumped element networks such as a lumped element RLC or LC network used to provide impedance matching, filtering, or bias networks for an amplifier, phase shift elements for a phase shifter, or other circuit elements.

Generally with lumped element networks, it is conventional to form the inductor elements of the networks as distributed or lumped element equivalents of an inductor. That is, it is common to use a strip conductor formed on a dielectric substrate having a controlled impedance to provide an inductor having a selected inductance at microwave frequencies. Similarly, it is also conventional to form metal insulator metal (MIM) capacitors on such a substrate and integrate such capacitors with the sections of strip conductor to form various combinations of inductors and capacitors.

It is also known that many applications of such MMICs have a requirement for low power operation or consumption. This requires the use of higher circuit impedances for transmission lines and other elements. In a filter, for example, in which low power consumption is a requirement, the value of inductance for the inductors scale directly with the characteristic impedance desired for the filter, whereas the values of capacitance for the capacitors are inversely proportional to the desired characteristic impedance. With such a circuit requirement therefore, it is often the case that the desired values of the capacitance required for a filter are very small. For example, it often arises that the required capacitance is not significantly different from the parasitic capacitance which is inherent in the particular circuit. This situation presents problems both for modelling the circuit, as well as, fabricating the circuit, since the small amount of capacitance needed makes practical fabrication difficult since tight tolerances must be held in the capacitors.

Generally, the approach used to solve this problem has been to compensate for the parasitic capacitance by using smaller shunt MIM capacitors in the filter so that the sum of the MIM capacitors and parasitic capacitance is the desired value. This compensation approach, however, is fraught with many problems. For example, the exact value of the parasitic capacitance is difficult to determine and may only be finally quantified after a design has been processed into a fabricated circuit. Moreover, using the parasitic capacitance of the filter in this manner may provide a requirement for a discrete capacitor having a very small value of capacitance which might be even more difficult to provide particularly within fixed process design rules as used throughout the industry.

SUMMARY OF THE INVENTION

In accordance with the present invention, an RF circuit which may be, for example a high pass filter, low pass filter, phase shifter, bandpass filter, termination network, or bias network includes at least one strip conductor coiled about a region and a second strip conductor disposed about a periphery of the at least one coiled strip conductor and coupled to said at least one coiled strip conductor through a dielectric. With this particular arrangement, by providing a coiled strip conductor an inductor is provided for the RF circuit element. By disposing a second strip conductor about the periphery of the coiled strip conductor, an effective, controlled parasitic capacitance is provided between the edges of the ring conductor and edges of the second strip conductor. Such an effective parasitic capacitance is thus integrated into the RF circuit and effectively provides a capacitor element of the RF circuit. Accordingly, with this arrangement, the capacitor element, as typically provided by the MIM capacitor is eliminated. The parasitic capacitance present between the peripheral edges of the coiled strip conductor and ring strip conductor is used as the capacitor element of the network. Thus, an RF circuit element having a capacitor and inductor coupled in any one of a number of desired configurations is provided. This arrangement will provide concomitant improvements in electrical performance for the particular circuit. For example, since the parasitic elements are used as an integral part of the circuit rather than as an element to be compensated for, such elements could have broader band widths where applicable, and designs using the coiled inductors and ring conductors will be more reproducible and reliable compared to the prior lumped element approaches. Since the MIM capacitors of the prior art have a yield factor and a process tolerance, the elimination of the MIM capacitors should also improve overall yields for the integrated circuits as well as providing improvements in performance for the circuits. Further, by eliminating the capacitors, the circuits may be smaller in area and thus the circuit costs are concomitantly reduced.

BRIEF DESCRIPTION OF THE DRAWINGS

The foregoing features of this invention, as well as the invention itself, may be more fully understood from the following detailed description of the drawings, in which:

FIGS. 1–4 are plan views of filter elements in accordance with the present invention;

FIGS. 1A–4A are schematic representations of equivalent circuits for the circuits respectively shown in FIGS. 1–4;

FIGS. 1B–4B are merged equivalent circuits for the equivalent circuits shown in FIGS. 1A–4A, respectively;

FIGS. 5–7 are plan views of further embodiments of the present invention;

FIGS. 5A–7A are schematic representations of the circuits shown in FIGS. 5–7, respectively;

DESCRIPTION OF THE PREFERRED EMBODIMENTS

Figure 8:
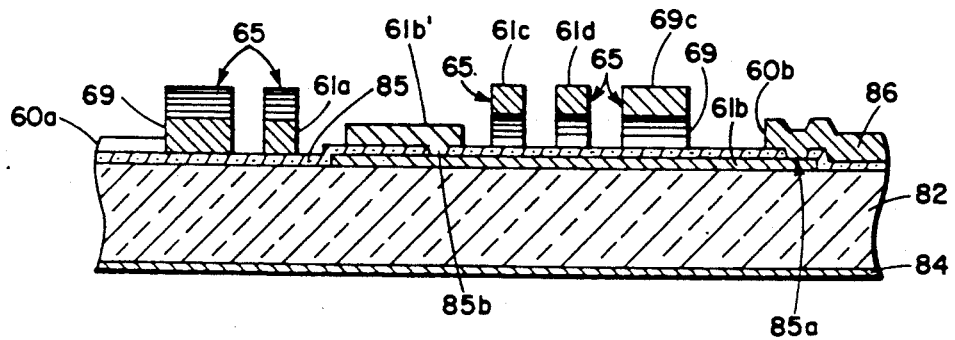
FIG. 8 is a cross-sectional view taken along line 8—8 of FIG. 6 showing typical construction for the devices as generally described in conjunction with FIGS. 1–7.

Referring now to FIG. 1, a low pass T filter network 10 having terminals 10a and 10b is here shown disposed on a substrate 82 as will be further described in conjunction with FIG. 8 and is shown to further include a strip conductor 11 having a first portion 11a having a first end coupled to terminal 10a and coiled about a first region 17a and further coiled outwardly from the portion thereof coupled to terminal 10a about the region 17a to provide a first coiled inductor element 12. The strip conductor 11 has a second portion 11b having a first end coupled to terminal 10b and coiled about a region 17b with said second strip conductor portion 11b being coiled outwardly from region 17b at the end portion thereof coupled to the terminal 10b. Such an arrangement provides a second coiled inductor 14. A second end of strip conductor portion 11b is connected directly to a second end strip conductor portion 11a, as is also shown.

The filter 10 further includes an outer strip conductor 19 disposed about the outer periphery of the coiled inductors 12 and 14, as also shown. The outer strip conductor 19 is here coupled to a reference potential such as ground, as shown, and further includes an optional central portion or septum 19a disposed to isolate each one of the coiled conductors 12, 14 and increase parasitic capacitance. Inner edges 16a' and 16b' of outer strip conductor 19 and septum 19a and corresponding outer edge portions 16a'' and 16b'' of corresponding strip conductor portions 11a and 11b, in combination with dielectric, here air and GaAs, disposed therebetween provide a parasitic capacitance here denoted as capacitor elements 16a and 16b (as shown in phantom in FIG. 1).

The filter 10 further has regions 15 where conductors cross over or are air-bridged over underlying conductors. Such regions 15 are used to provide a substantially planar topography for the circuit element while permitting conductors to cross each other but not touch each other, as is generally known in the art.

Referring now also to FIGS. 1A and 1B, together, it is shown that the equivalent circuit of the arrangement discussed in conjunction with FIG. 1 is that of a low pass T filter network 10' with inductor elements 12' corresponding to the first coiled inductor 12 (FIG. 1), a second inductor element 14' corresponding to the second coiled inductor element 14 (FIG. 1). Capacitors 16a, 16b (shown in phantom) are the equivalent of the parasitic capacitance provided between the inner edges 16a', 16b' of the ring conductor 19 (FIG. 1) and septum 19a and the corresponding outer edges 16a'', 16b'' of the strip conductor 11a, 11b (FIG. 1) which are disposed adjacent and dielectrically separated therefrom. With the ring conductor and septum 19a being coupled to a ground potential and with the inductors coiled about the central regions 17a, 17b outwardly to meet each other as shown, the structure of FIG. 1 has an equivalent circuit of a low pass T filter as shown in FIG. 1A or a merged version thereof as shown in FIG. 1B with capacitor 16' being the effective parallel capacitance (i.e. added capacitance) of capacitors 16a and 16b (FIG. 1A).

It should be noted that all of the circuits to be described forthwith are disposed on a substrate 82 as will be further discussed in conjunction with FIG. 8.

Referring now to FIG. 2, a low pass $\pi$ filter 20 is shown to include a pair of terminals 20a, 20b and a strip conductor 21 having a first portion 21a coiled about a region 27a and a second portion 21b coiled about a region 27b. Here each one of the coiled strip conductors are coiled inwardly from the connections to their respective terminals 20a, 20b of the network, as shown. Coiled strip conductor portion 21a provides coiled inductor 22a and coiled strip conductor 21b provides coiled inductor 22b. The low pass $\pi$ filter 20 further includes an outer strip conductor 29 coupled to a reference potential, here ground, as shown having a central septum 29a disposed between the coiled inductors 22a, 22b. As was discussed in FIG. 1, parasitic capacitance between here the inner edges 26a' of the outer strip conductor 29, septum 29a, and outer edges 26a'' of strip conductor 21, as well as corresponding inner edges 28a' of the septum 29a and ring conductor 29, and outer edges 28a' coiled strip conductor portion 21b provide respective parasitic capacitance here represented as capacitors 26, 28 (shown in phantom). As also discussed above, crossing conductors are isolated by overlays generally denoted by 25. The first ends of conductor portions 21a, 21b are coupled to respective terminals of 20a, 20b of the network whereas the second ends are coupled together and thus meet each other underneath a portion of the septum 29a which is air bridged 25 over the strip conductor portions 21a, 21b as also shown.

The equivalent circuit of the network described in conjunction with FIG. 2, as well as the merged equivalent circuit thereof are shown in FIGS. 2A and 2B, respectively. FIG. 2A shows the equivalent inductors 22a', 22b' and capacitors 26 and 28 (in phantom) whereas FIG. 2B shows the equivalent series inductance 22' disposed as a series element of a $\pi$ network with capacitors 26 and 28 (in phantom) disposed as shunt elements to ground of said network.

Referring now to FIG. 3, a high pass T filter 30 is shown having a pair of terminals 30a, 30b coupled to the filter 30 via a pair of strip conductors (not numbered) and is shown to include a first coiled conductor portion 31a disposed about a first region 37a and a second coiled conductor portion 31b disposed about a second region 37b, as shown. Here each of said coiled conductors has a first end coupled to a reference potential such as ground with said coiled region from the first end coiled outwardly from the respective regions 37a, 37b, as also shown. Again, as for the embodiments described above, crossing conductors are spaced by overlays 35. Coiled conductor portion 31a provides a first inductor 32a while coiled conductor portion 31b provides a second inductor 32b.

The filter 30 is shown to further include first and second outer strip conductors 39a, 39b disposed about respectively inductor 32a and inductor 32b, as shown. Here inner edges of 36a' of ring conductor 39a in combination with outer edges 36a'' of strip conductor portion 31a disposed adjacent said outer conductor 39a provide in combination with the dielectric, here air and GaAs, a parasitic capacitance here denoted as capacitor 36 (shown in phantom). Similarly, a second capacitor 38 is provided by corresponding edges 38a' and 38a'' and dielectric, as shown. Terminals 30a, 30b of the network 30 are connected directly to the outer conductors 39a, 39b.

The equivalent circuit 30' (FIG. 3A) of the circuit shown in FIG. 3 thus is a pair of capacitors 36', 38' (shown in phantom) coupled in series with a pair of inductors 32a, 32b coupled between the common connection of the capacitors 36', 38' and ground. The merged equivalent circuit 30" of this arrangement is thus a T high pass filter having capacitors 36', 38' and an inductor 32 which corresponds to the equivalent inductance (i.e. the parallel combination of inductors 32a and 32b).

Figure 4A:
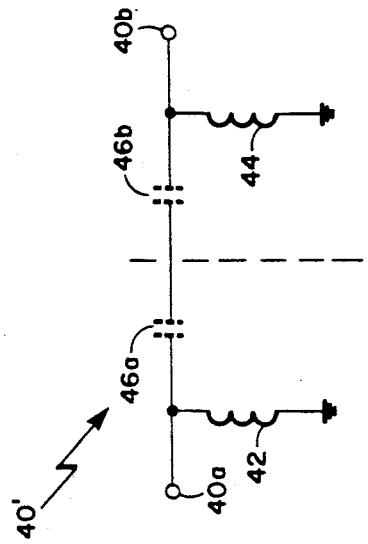
Figure 4B:
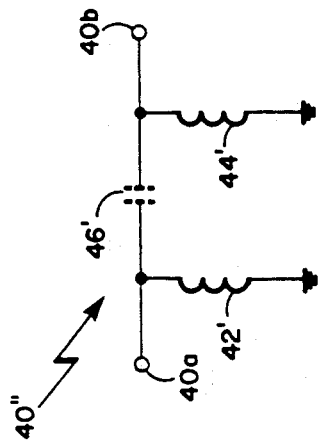
Figure 4:
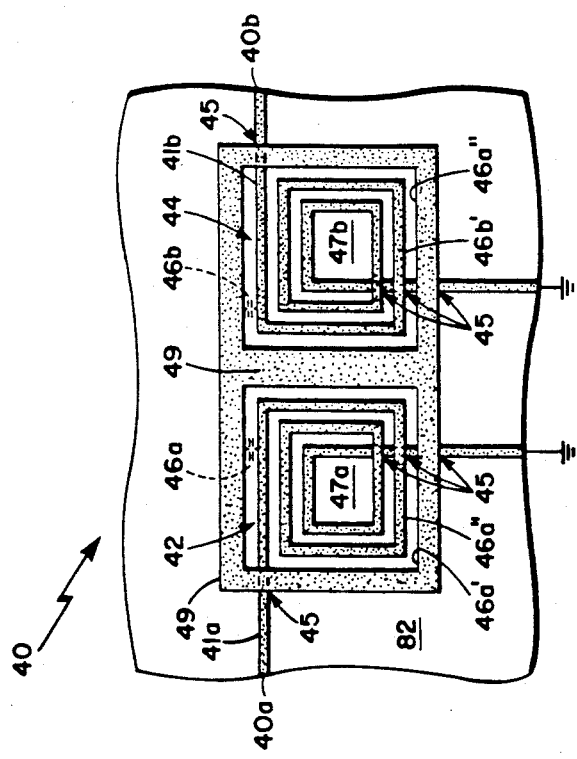

Referring now to FIG. 4, a further embodiment, here a high pass $\pi$ network 40 having input terminals 40a and 40b is shown to include a first coiled strip conductor 41a coiled about a region 47a and a second coiled strip conductor 41b disposed about a second region 47b. Here first ends of said coiled strip conductors 41a, 41b are coupled to respectively first and second terminals 40a, 40b of the network, whereas second ends of said coiled strip conductors 41a, 41b are coupled to a reference potential, here ground. Said strip conductors 41a, 41b are coiled inwardly towards the regions 47a, 47b from the ends thereof coupled to the terminals 40a, 40b. Each of these coiled conductors provide inductor elements 42, 44. The filter 40 is shown to further include a outer strip conductor 49 having a central septum 49a disposed to isolate the inductors 42 and 44 as also shown. Parasitic capacitance which is provided between edges 46a' of outer strip conductor 49 and septum 49a and edge 46a" of strip conductor 41a, as shown, provide a parasitic capacitance here denoted as capacitor element 46a (shown in phantom). Parasitic capacitance is also provided between edges 46b' and 46b" to provide a parasitic capacitance element denoted as capacitor element 46b (in phantom).

The equivalent circuit 40' and the merged equivalent circuit 40" of the network shown in FIG. 4 are depicted in FIGS. 4A and 4B, respectively. FIG. 4B shows the equivalent capacitance 46' which is the series combination of capacitances 46a and 46b (shown in FIG. 4A). Inductor elements 42 and 44 are shown as shunt elements of each one of the networks shown in FIGS. 4A and 4B.

Referring now to FIG. 5, an alternate embodiment of a high pass T filter 50, here referred to as a "split ring" high pass T filter is shown having a pair of input terminals 50a, 50b. A coiled strip conductor 51 is shown coiled about a region 57 having one end terminated in a reference potential such as ground and having said coiled conductor coiled outwardly from said region 57 at a portion thereof starting at the grounded end of the conductor. The other end of the conductor is left in an open circuit. The coiled conductor thus provides an inductor element 52. Disposed adjacent said coiled conductor are a pair of split here bifurcated outer strip conductor portions 59a, 59b which provide respective input and output connections to the filter 50, as well as, respective inner wall portions 58a, 56a which, in combination with the outer portions of the strip conductor, provide parasitic capacitances which are represented as capacitors 56 and 58 (shown in phantom). The equivalent circuit 50' of this filter 50 is shown in FIG. 5A having capacitors 56 and 58 (in phantom) as series elements of the filter with the inductor 52 disposed as a shunt element between the common connections of said capacitors and ground.

Figure 6:
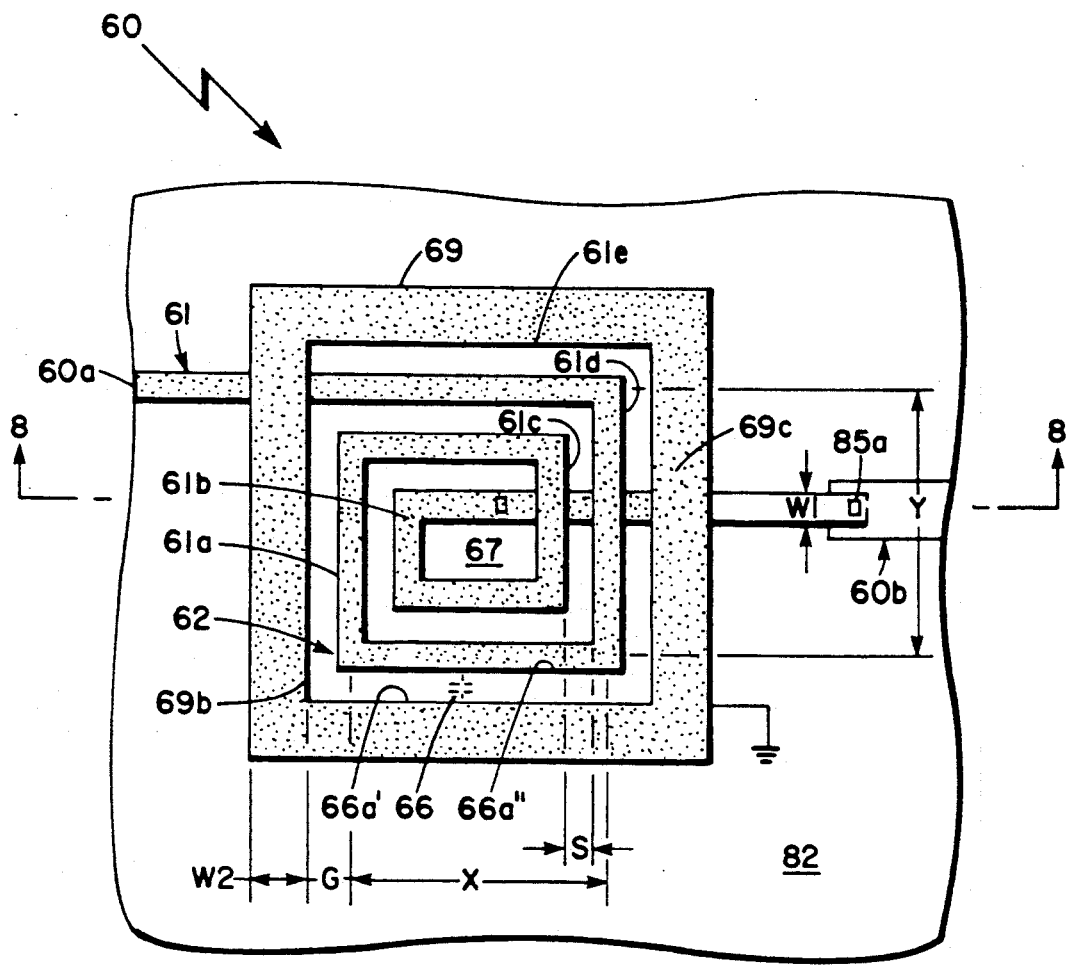
Figure 6A:
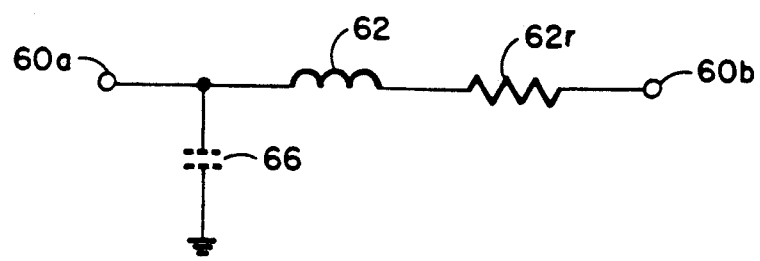
Figure 7:
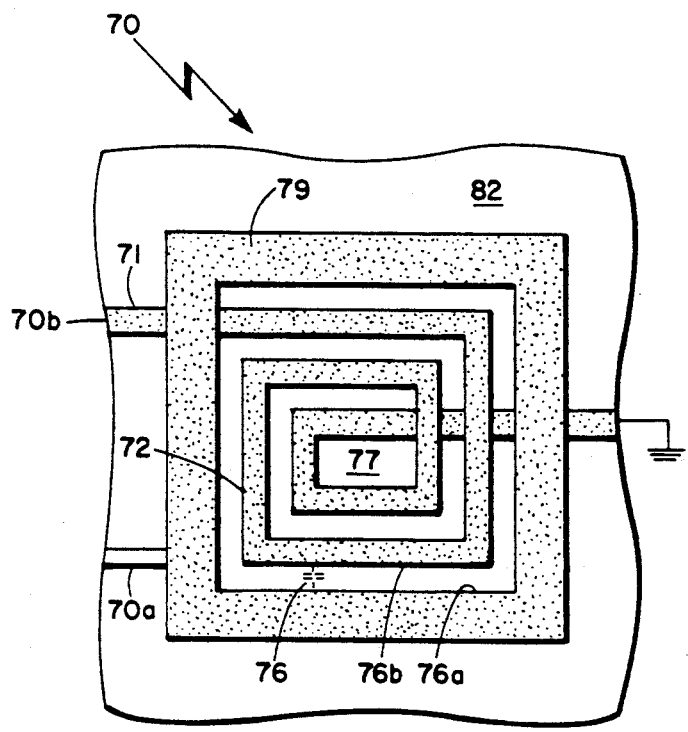
Figure 7A:
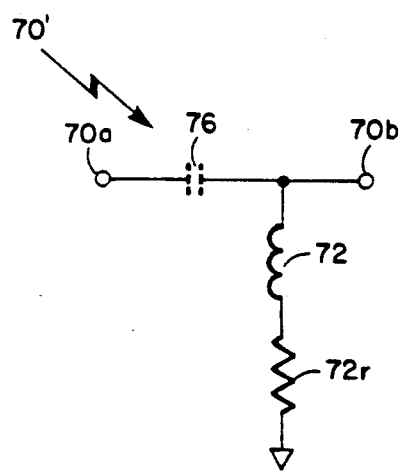

Referring now to FIGS. 6 and 7, as well as their respective equivalent circuits FIGS. 6A and 7A, alternative embodiments of the present invention are shown.

In FIG. 6A, a strip conductor 61 is shown coiled about a region 67 and provides an inductor 62. Conductor 61 is coiled N number of turns about the region 67, here three, two and one quarter turns being shown. Conductor 61 has denoted portions 61a–61e which will be further described in conjunction with FIG. 8. The strip conductor 61 has a width $W_1$, outer first and second legs having a length X and Y, respectively, a inter-electrode gap distance or separation G, and an outer strip conductor width $W_2$. The coiled inductor 62 further has an inner electrode spacing between turns of the conductor denoted as S. Outer strip conductor 69 having inner edges 66a' as well as, corresponding outer edges 66a" of the coiled conductor 61 provide, in combination with air and substrate dielectric here GaAs disposed therebetween, a parasitic capacitance here denoted as a capacitor 66.

This arrangement provides between terminal 60a and 60b the equivalent circuit as shown in FIG. 6A which may be used, for example, as a termination network or a matching network or a filter element. It is to be noted that to a first approximation, the inductance L of inductor 62 is a function of (X, Y, $W_1$, S, and N), whereas the capacitance (C) of capacitor 66 is a function of (X, Y, $W_1$, $W_2$, and G) and resistance (R) of resistor 62r (the inherent resistance provided by the resistivity of the conductor 61) is a function of (X, Y, $W_1$, and N).

Although not shown in the preceding FIGS. 1–6 and their respective equivalent circuits, each of the conductors which provide an inductor also have an inherent resistance which should be taken into consideration when modelling the filter. Such a parasitic resistance will affect the insertion loss of the elements.

Referring now to FIGS. 7 and 7A, a further embodiment of a termination network 70 is shown to include a coiled strip conductor 71 coiled about a region 77 and an outer strip conductor 79. Inner edges 76a of outer conductor 79 and the outer edges 76b of coiled conductor 71 provide a parasitic capacitance denoted as capacitor element 76, as shown (in phantom).

The equivalent circuit 70' (FIG. 7A) of the network 70 is shown to include inductor 72 and resistance 72r (the series resistance of the strip conductor 71) connected in series and disposed in shunt between a parasitic capacitance denoted as capacitor 76 (shown in phantom) and ground. The capacitor 76 is connected between terminals 70a, 70b of network 70.

Referring now to FIG. 8, a cross-sectional view of matching network 60 of FIG. 6 is shown to illustrate a typical construction of any of the circuits described thus far or to be described. Thus, the circuit 60 is shown disposed on the substrate 82, here comprised of any suitable dielectric whether insulating or semi-insulating material and, in particular, comprised of a material suitable for use at microwave frequencies particularly in the range of 1–20 gigahertz, such frequency range being the general range over which lumped element circuit components are most easily provided. Suitable dielectric materials include high-resistivity silicon, aluminum oxide, quartz, Duroid and, in particular, Group III-V materials such as gallium arsenide which is here used.

When the above described circuits are fabricating on substrates which support microstrip transmission lines, disposed over one surface of the substrate would be a ground plane conductor comprised of gold, as well as suitable adherent layers as is commonly known. The presence of the general plane will provide parasitic capacitances between the general plane and the strip conductors. This would make the circuits behave less than ideal and complicate modelling. A preferred approach, therefore, is to have the substrate as thick as possible. A more preferred approach is to have the general plane on the same side of the substrate as the patterned strip conductors. Propagation media such as co-planar waveguide is thus preferred. When the outer conductor is to be grounded such as in the embodiments of FIGS. 1, 2, and 6, the outer conductor can be part of the co-planar waveguide ground plane or alternated is closely connected to it. On the other hand, if the outer conductor is not connected to ground as, for example, when it is used as a signal terminal as in FIGS. 3, 4, and 5, then it should be removed somewhat from the co-planar waveguide ground plane.

Disposed over a second surface of substrate 82 are patterned metal layers including outer strip conductor 69 as well as strip conductor 61, as well as, a thick metal portion 61b' coupled to layer 61b by a via 85b. Strip conductor portion 61b is shown disposed on the substrate 82 and is generally provided as a thin layer to facilitate air bridge construction thereover as will be described. Disposed over strip conductor portion 61b and the second surface of substrate 82 is a passivation layer 85 as shown here comprised of $Si_3N_4$. Passivation layer 85 has apertures here one aperture 85a being shown through which a thick metal conductor 60b can be interconnected to conductor 61b. Strip conductor portions 61c, 61d of the strip conductor 61, as well as portions 69b, 69c of ring conductor 69 and circuit terminal connection 60a, 60b are provided as thick top metal interconnects disposed over the substrate 82 and passivation layer 85, as shown. The top metal layer further has air bridge portions 65 disposed over underlying portions (61b) of the metal layer 61. Here external connection is made to the circuit 60 by thick metal conductors here shown as conductor 86 which connects to underlying conductor 61b through via 85a in passivation layer 85.

Figure 9:
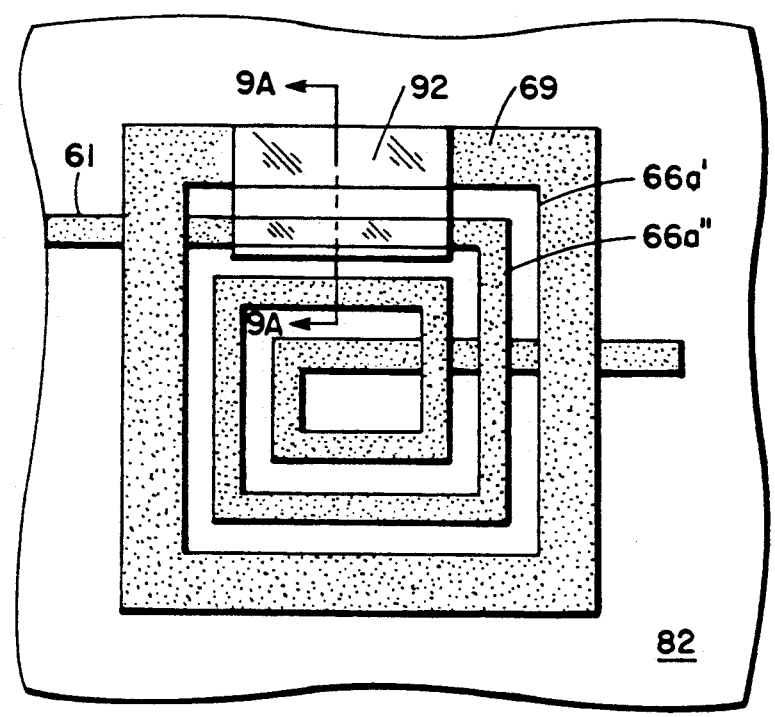
FIG. 9 is a plan view of a further embodiment of the present invention having a dielectric overlay.
Figure 9A:
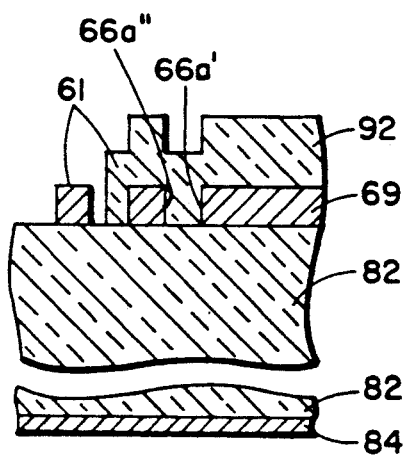
FIG. 9A is a cross-sectional view taken along 9A—9A of FIG. 9.

Referring now to FIGS. 9 and 9A, a further embodiment of the invention is shown. Here the circuit selected to depict the further embodiment is the circuit element 60 generally described with conjunction with FIG. 6. Here the circuit 60 has added thereto an overlay 92 comprised of a suitable dielectric material having a dielectric permittivity $\epsilon$ greater than that of air. Examples include silicon nitride polymide or other suitable dielectric materials. The dielectric layer 92 is disposed in particular between the edges 66a', 66a" of the outer strip conductor 69 and outer portion of the strip conductor 61, as shown. By choosing the dielectric permittivity of the dielectric layer 92, a higher value of parasitic capacitance is provided between the edges and thus other values of capacitance other than that provided by using air and the substrate alone as a dielectric may be provided. This option comes at the expense of a slight increase in the complexity of the circuit.

Referring now to FIGS. 10 and 10A, a series resonance circuit 100 is shown having a pair of terminals 100a, 100b and is further shown to include a coiled conductor portion 101 disposed about a region 107. Here coiled conductor portion 101 is coiled outwardly from the end thereof coupled to terminal 100a and the end portion of conductor 101 is terminated in an open circuit. The series resonance circuit 100 is shown to further include an outer strip conductor 109 disposed about the periphery of strip conductor 101. Here strip conductor 101 provides a coiled conductor and inner edges 106a of outer strip conductor 109 and adjacent edges 106b portions of strip conductor 101 provide, in combination with a dielectric therebetween, here air and gallium arsenide, a parasitic capacitance, here denoted as capacitor 106 (shown in phantom). The second terminal 100b of the resonator 100 is connected to outer strip conductor 109, as shown. Air bridges 105 are disposed between the outer strip conductor 109 and underlying coiled strip conductor 101, as well as between the crossing portions of the coiled strip conductor 101, as generally shown.

Referring to FIG. 10A, equivalent circuit 100' of the arrangement described in conjunction with FIG. 10 is shown. Here the circuit is a series resonance circuit 100' having disposed between terminals 100a, 100b, a series connection of a inductor 102 and capacitor 106 (shown in phantom).

Referring now to FIG. 11, a parallel resonance circuit 110 is shown having a pair of terminals 110a, 110b and a strip conductor 111 coiled about a region 117, here the coiled strip conductor is coiled outwardly from the portion of the strip conductor coupled to terminal 110a, about the region 117 to the second portion of the strip conductor coupled at terminal 110b. Coiled conductor 111 provides a coiled inductor 112, as shown. The coiled conductor 111 is dielectrically spaced from underlying crossing portions thereof by air bridges 115, as also shown. An outer strip conductor 119 is disposed about the periphery of the coiled strip conductor 111. Inner edge surfaces 116a of outer strip conductor 119, as well as adjacent inner surfaces 116b of the coiled strip conductor 111, provide, in combination with the dielectric disposed therebetween, here air and gallium arsenide, a parasitic capacitance, here denoted as capacitor 116 (shown in phantom). Strip conductor 111 is coupled to outer strip conductor 119 in region 113, as shown, thus providing the capacitor 116 in parallel with the inductor 112. As shown in FIG. 11a, the circuit of circuit 110 is a parallel resonator circuit having an inductor 112 and a capacitor 116 (shown in phantom) coupled in parallel between terminals 110a and 110b. It should be noted that neither the series resonance nor the parallel resonances circuits need operate at their resonance frequencies. In many applications, they operate a frequency far removed from resonance.

A typical design methodology for providing any of the above circuits having selected values of inductance for the coiled inductors and parasitic capacitance is to estimate the periphery needed to provide the desired capacitance. On gallium arsenide the capacitance is about $9.5 \times 10^{-5} pF/\mu m$. The periphery is the length of the outer edge of the coiled inductor which is adjacent the inner edge of the outer strip conductor. After this size has been determined, the inductor can be designed by choosing inductor parameters such as width, interturn spacing, and number of turns of the conductor strips to obtain the desired inductance. The length and width (i.e. X and Y dimension in FIG. 6) may be incorrect after the inductor has been first designed. In such a case, the distance or gap between outer strip conductor and the strip conductors of the inductors can be adjusted to achieve the desired capacitance in the given space. This process of choosing periphery and adjusting inductor parameters can be repeated as many times as necessary to obtain correct values of inductance and capacitance for the particular design. Generally one of skill in the art would model these types of circuits on a computer using software adapted to design elements at microwave frequencies.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. An RF circuit comprising:
    a first strip conductor having edge portions, said strip conductor coiled about a region to provide a spiral inductor having peripheral edge portions; and
    an outer conductor disposed in substantially the same plane as the first strip conductor and about a substantial periphery of the peripheral edge portions of said spiral inductor and coupled to said first strip conductor through a dielectric disposed therebetween.

2. The circuit of claim 1 wherein said dielectric includes air.

3. The circuit of claim 2 wherein said outer conductor is disposed completely about the periphery of the first strip conductor.

4. The circuit of claim 3 wherein said outer conductor is connected to a reference potential and wherein first and second ends of said first strip conductor provide input and output terminals of the circuit.

5. The circuit of claim 3 wherein said spiral inductor is a first spiral inductor coiled about a first region, and said RF circuit further comprises:
    a second spiral inductor provided by a second strip conductor coiled about a second, different region; and
    wherein said outer strip conductor is disposed completely about peripheries of said first and second strip conductors.

6. The circuit of claim 5 further comprising a septum portion disposed between said first and second strip conductors.

7. The circuit of claim 6 wherein said outer strip conductor is connected to a reference potential.

8. The circuit of claim 7 wherein said first and second strip conductors are each coiled outwardly from the respective first and second regions, towards said outer strip conductor, with an end of each one of said first and second conductors disposed closest to the first and second regions of said strip conductors providing respective first and second terminals of the circuit and with the ends disposed adjacent outer most portions of said coiled strip conductors electrically connected together.

9. The circuit of claim 7 wherein said first and second strip conductors are each coiled inwardly towards the respective first and second regions, from said outer strip conductor, with an end of each one of said first and second conductors disposed closest to the outer conductor providing respective first and second terminals of the circuit and with the ends disposed adjacent inner most portions of said first and second strip conductors electrically connected together.

10. The circuit of claim 5 wherein first ends of said first and second strip conductors are connected to a reference potential, and second ends of said first and second strip conductors are connected to first and second terminals of said circuit.

11. The circuit of claim 2 wherein said first strip conductor is coiled about a first region, and said outer strip conductor is a first outer strip conductor disposed about the periphery of said first coiled conductor, said circuit further comprising:
    a second strip conductor coiled about a second, different region; and
    a second outer strip conductor disposed about the periphery of the second coiled conductor with first ends of said first and second coiled conductors coupled to a reference potential and said first and second outer strip conductors providing first and second terminals of said circuit.

12. The circuit, as recited in claim 3, wherein a first end of said first strip conductor is disposed at a reference potential and a second end of said first strip conductor provides one of the terminals of the circuit, with the outer strip conductor disposed to provide the second terminal of the circuit.

13. The circuit, as recited in claim 1, wherein said outer strip conductor has a split, having first and second portions disposed about the first strip conductor and wherein a first end of said first strip conductor is coupled to a reference potential with the second end of said first strip conductor is left open circuited, and said split outer strip conductor portions provide first and second terminals of the circuit.

14. The circuit of claim 3 wherein said first strip conductor is coiled outwardly from a central portion of said circuit from a first end of said first conductor with said first end providing a first terminal of the circuit and wherein said second terminal is provided by the conductor disposed about the periphery of the at least one first strip conductor.

15. The circuit, as recited in claim 14, wherein in said circuit is series resonance circuit.

16. The circuit, as recited in claim 3, wherein said first strip conductor is coiled outwardly about a central region of the circuit from a first portion of the conductor and wherein said first portion of said first strip conductor is electrically connected to a portion of the outer strip conductor disposed completely about said at least one first strip conductor.

17. The circuit, as recited in claim 16, wherein said circuit is a parallel resonance circuit.

18. An RF circuit comprising:
    a substrate supporting an inductor and capacitor;
    the inductor comprising a first strip conductor disposed over said substrate coiled about a first region of said substrate; and
    an outer, different strip conductor disposed over said substrate about a substantial periphery of the first strip conductor and with edge portions of said first strip, conductor disposed adjacent immediate edge portions of said outer strip conductor in combination with dielectric therebetween providing the capacitor of the circuit.

19. The circuit of claim 18 wherein said substrate is GaAs and said dielectric is air and GaAs.

20. The circuit of claim 19 wherein said outer strip conductor is disposed completely about the periphery of the first strip conductor.

21. The circuit of claim 20 wherein said outer strip conductor is connected to a reference potential and wherein first and second ends of said first strip conductor provide input and output terminals of the circuit.

22. The circuit of claim 21 wherein said RF circuit further comprises:
    a second strip conductor disposed over said substrate and coiled about a second, different region of said substrate; and
    wherein said outer strip conductor is disposed completely about peripheries of said first and second strip conductors and further comprises a septum portion disposed between said first and second strip conductors.

23. The circuit of claim 19 wherein said outer strip conductor is a first outer strip conductor disposed about the periphery of said first strip conductor, said circuit further comprising:

a second strip conductor disposed over said substrate and coiled about a second, different region of said substrate;

a second outer strip conductor disposed over said substrate and about the periphery of the second coiled conductor with first ends of said first and second strip conductors coupled to a reference potential and said first and second outer strip conductors providing first and second terminals of said circuit.

24. The circuit, as recited in claim 20, wherein a first end of said first strip conductor is disposed at a reference potential and a second end of said second strip conductor provides one of the terminals of the circuit with the outer strip conductor disposed to provide a second terminal of the circuit.

25. The circuit, as recited in claim 18, wherein said outer strip conductor is bifurcated having first and second portions disposed over said substrate and about corresponding first and second, different portions of said first strip conductor and wherein a first end of said strip conductor is coupled to a reference potential with the second end of said strip conductor left open circuited and said bifurcated outer strip conductor portions providing first and second terminals of the circuit.

* * * * *